(12) United States Patent
Shi et al.

(10) Patent No.: US 12,281,007 B2
(45) Date of Patent: Apr. 22, 2025

(54) MEMS MICROPHONE

(71) Applicant: AAC ACOUSTIC TECHNOLOGIES (SHENZHEN) CO., LTD., Shenzhen (CN)

(72) Inventors: Zhengyu Shi, Shenzhen (CN); Linlin Wang, Shenzhen (CN); Rui Zhang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 423 days.

(21) Appl. No.: 17/827,817

(22) Filed: May 30, 2022

(65) Prior Publication Data
US 2023/0234832 A1     Jul. 27, 2023

(30) Foreign Application Priority Data

Jan. 27, 2022   (CN) .......................... 202220231023.3

(51) Int. Cl.
*B81B 3/00* (2006.01)
*H04R 31/00* (2006.01)

(52) U.S. Cl.
CPC ......... *B81B 3/0021* (2013.01); *H04R 31/006* (2013.01); *B81B 2201/0257* (2013.01); *B81B 2203/0127* (2013.01); *B81B 2203/0315* (2013.01); *H04R 2201/003* (2013.01)

(58) Field of Classification Search
CPC .......... B81B 3/0021; B81B 2201/0257; B81B 2203/0127; B81B 2203/0315; H04R 31/006; H04R 2201/003; H04R 19/04; H04R 19/005
See application file for complete search history.

(56) References Cited

U.S. PATENT DOCUMENTS

| | | | |
|---|---|---|---|
| 2010/0158279 A1* | 6/2010 | Conti | H04R 19/005 381/174 |
| 2012/0319217 A1* | 12/2012 | Dehe | B81C 1/00182 438/488 |
| 2019/0116427 A1* | 4/2019 | Inoue | B81B 3/0072 |
| 2022/0396469 A1* | 12/2022 | Chen | H04R 7/06 |

\* cited by examiner

*Primary Examiner* — Jonathan Han
(74) *Attorney, Agent, or Firm* — Wiersch Law Group

(57) ABSTRACT

The present invention provides a MEMS microphone including a substrate with a back cavity and a capacitive system disposed on the substrate. The capacitive system includes a back plate and a vibration diaphragm arranged opposite to the back plate. The back plate includes a middle part and a fixed part surrounding the middle part and fixed to the substrate. The fixed part is arranged with a thickness greater than that of the middle part, and the fixed part includes a first surface away from the substrate and a second surface opposite to the first surface. The first surface includes a first arc connected to the middle part, and the first arc protrudes away from the substrate. Compared with related technologies, the MEMS microphone provided by the present invention can improve the reliability of the back plate.

9 Claims, 3 Drawing Sheets

MEMS MICROPHONE

FIELD OF THE PRESENT DISCLOSURE

The invention relates to the technical field of electro-acoustic transducers, in particular to a MEMS (Micro-Electro Mechanical System) microphone.

DESCRIPTION OF RELATED ART

Mobile communication technology is arranged with developed rapidly in recent years, and consumers are increasingly using mobile communication equipment, such as cellular phones, Internet-enabled cellular phones, personal digital assistants, or other equipment for communicating over private communication networks. Wherein, the microphone is one of the important components, especially the MEMS microphone.

Micro-Electro-Mechanical System (MEMS) microphone is a kind of electric-powered sound transducer produced by micro-machining technology. It has the characteristics of small size, good frequency response characteristics and low noise. With the development of miniaturization and thinning of electronic equipment, MEMS microphone is more and more widely used in such equipment.

The MEMS microphone in the related art includes a substrate having a back cavity and a capacitive system provided on the substrate. The capacitive system includes a back plate and a vibration diaphragm arranged opposite to the back plate. The back plate includes a middle part, a fixed part connected to the substrate, and a connection part that connects the middle part and the fixed part. The connection part is perpendicular to the middle part and the fixed part, that is, the back plate and the substrate are directly connected at right angles. When the MEMS microphone is subjected to a large sound pressure, there is a force concentration at the right-angle connection, which makes the back plate easy to break and reduces the reliability of the back plate.

Therefore, it is necessary to provide an improved MEMS microphone to solve the above problems.

SUMMARY OF THE PRESENT INVENTION

The purpose of the present invention is to provide a MEMS microphone with improved signal to noise ratio.

Accordingly, the MEMS microphone comprises: a substrate with a back cavity and a capacitive system supported by the substrate. The capacitive system is supported by the substrate and includes a back plate and a vibration diaphragm fixed on the substrate at a side of the back plate close to the substrate. The back plate includes a middle part, a fixed part surrounding the middle part and being fixed to the substrate. A thickness of the fixed part is greater than a thickness of the middle part. The fixed part includes a first surface away from the substrate and a second surface opposite to the first surface; and the first surface includes a first arc connected to the middle part and protruding away from the substrate.

In addition, the first surface further includes a second arc connected to the first arc and protruding away from the substrate.

In addition, the fixed part includes a main body part and an insulation layer stacked on the main body part, and the insulation layer is connected to the first surface of the fixed part.

In addition, the main body part has a thickness same to the middle part.

In addition, the main body part and the insulation layer are made of the same material.

In addition, the main body part and the insulation layer are made of different materials.

In addition, the main body part and the insulation layer are of integrated structure or separated structure.

In addition, the insulation layer is a hollow ring structure.

In addition, the main body part and the insulation layer have the same shape.

In addition, the first surface and the second surface have the same shape.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Figure 1:
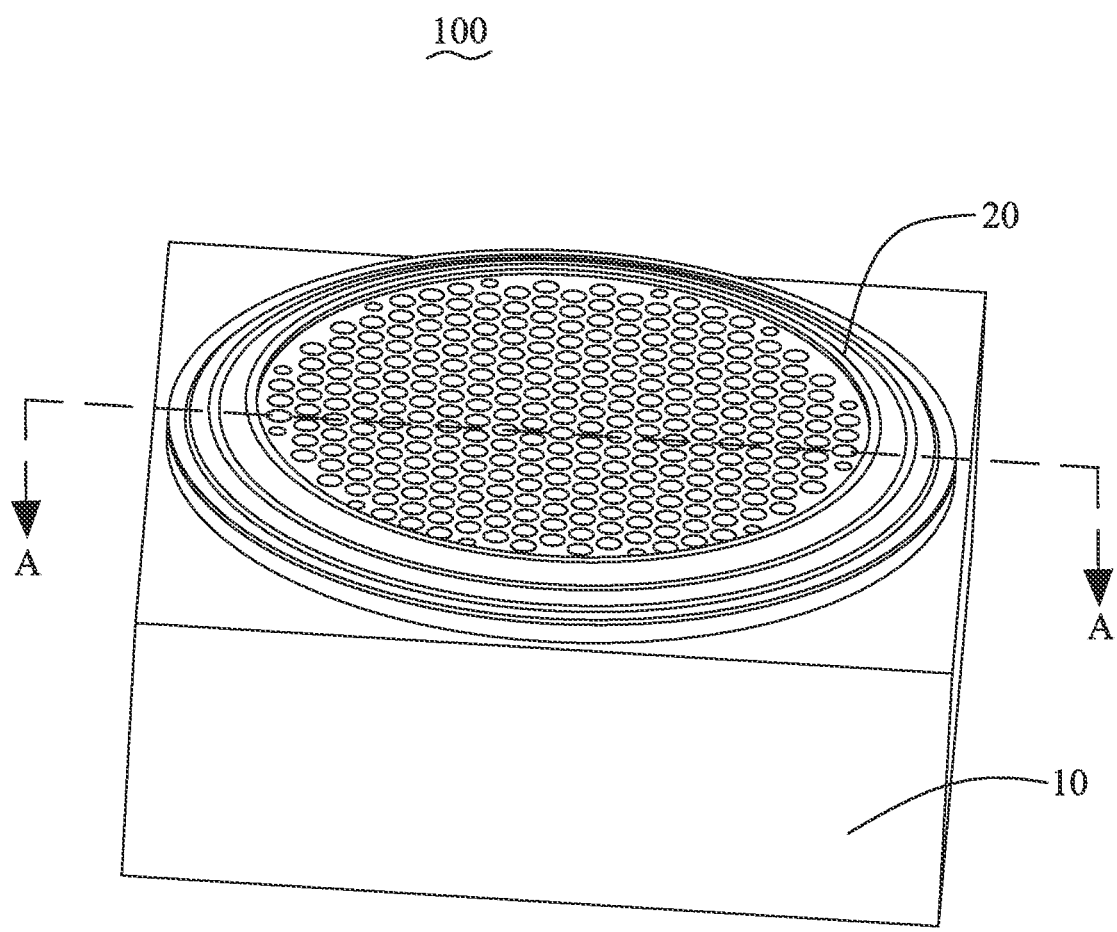
FIG. 1 is an isometric view of a MEMS microphone in accordance with an embodiment of the present invention.
Figure 2:
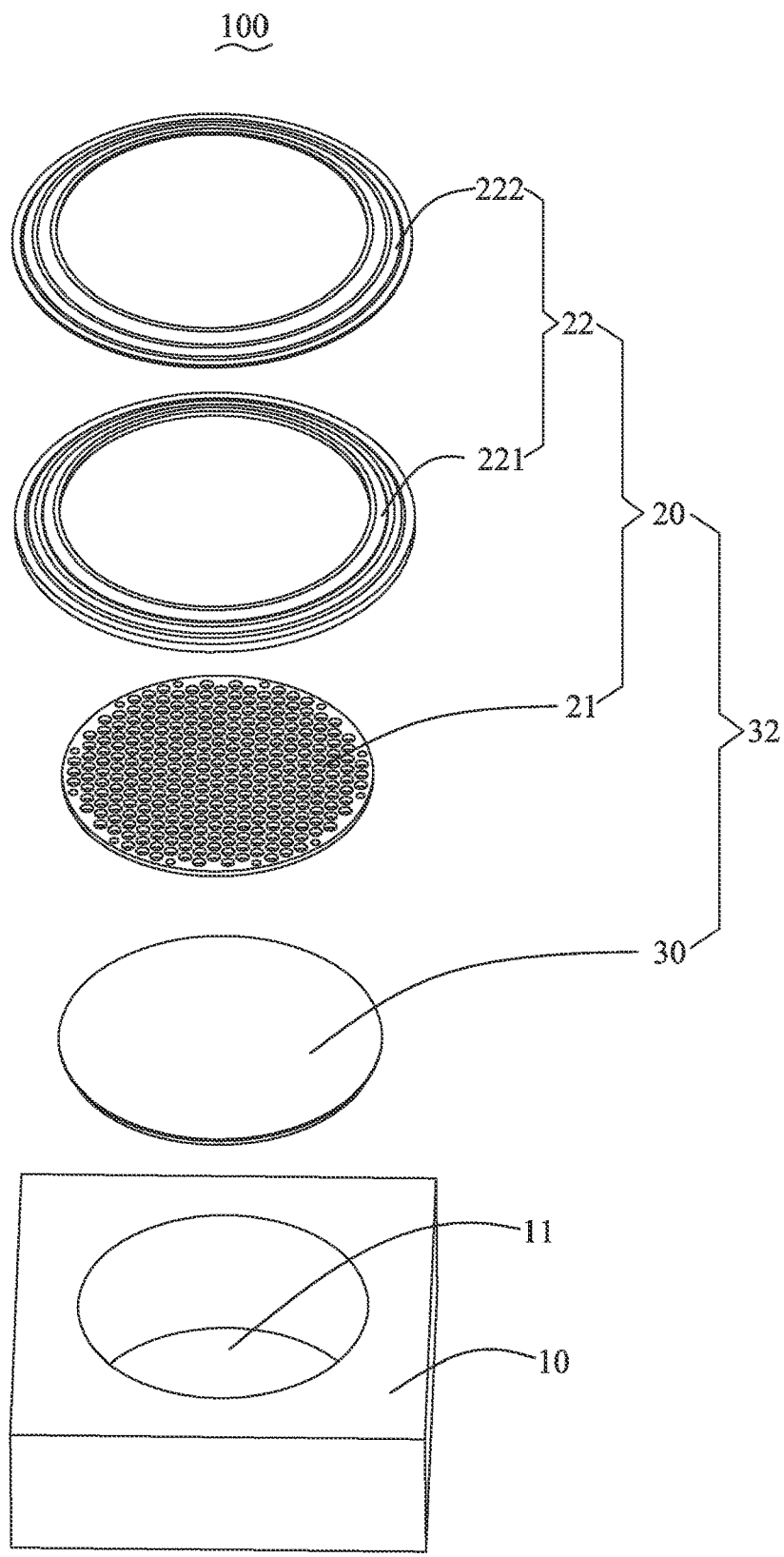
FIG. 2 is an exploded view of the MEMS microphone in FIG. 1.
Figure 3:
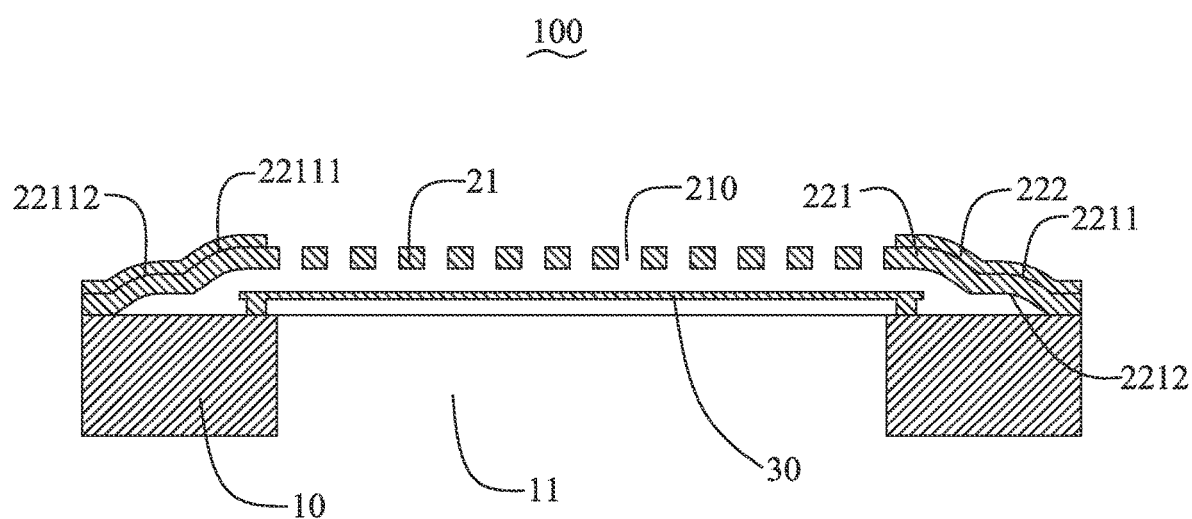
FIG. 3 is a cross-sectional view of the MEMS microphone, taken along line A-A in FIG. 1.

Please refer to FIGS. 1-3. A MEMS microphone 100 of an embodiment of the present invention, includes a substrate 10 with a back cavity 11 and a capacitive system 32 arranged on the substrate 10. The capacitive system 32 includes a back plate 20 and a vibration diaphragm 30 disposed opposite to the back plate 20. Both the back plate 20 and the vibration diaphragm 30 are fixed to the substrate 10, and the vibration diaphragm 30 is located on the side of the back plate 20 close to the substrate 10.

The back plate 20 includes a middle part 21 and a fixed part 22 surrounding the middle part 21 and fixed to the substrate 10. The middle part 21 is provided with a plurality of through holes 210. And the projection of the middle part 21 on the vibration direction of the vibration diaphragm 30 is all located in the vibration diaphragm 30. The fixed part 22 includes a first surface 2211 away from the substrate 10 and a second surface 2212 opposite to the first surface 2211. The first surface 2211 includes a first arc 22111 connected to the middle part 21 and a second arc 22112 surrounding the first arc 22111 and connecting the first arc 22111. Both the first arc 22111 and the second arc 22112 protrude away from the substrate 10. first arc 22111 and the second arc 22112 can improve the force distribution at the connection between the back plate 20 and the substrate 10, which can improve the performance of the MEMS microphone 100. Preferably, the first surface 2211 and the second surface 2212 have the same shape.

In this embodiment, the thickness of the fixed part 22 is greater than that of the middle part 21, so that the rigidity of the back plate 20 can be increased, so that it can generate less force under the same sound pressure, thereby improving the reliability of the back plate 20.

Specifically, the fixed part 22 includes a main body part 221 and an insulation layer 222 stacked on the main body part 221, and the main body part 221 and the middle part 21 have the same thickness. Compared with providing a conductive layer, the thickness of the insulation layer 222 can be made higher, which is more beneficial to increase the rigidity of the back plate 20 and improve the reliability of the back plate 20. The main body part 221 and the insulation layer 222 can be made of the same material, and the main body part 221 and the insulation layer 222 can be integrally formed, with an integrated structure or a separate structure. In other embodiments, the main body part 221 and the insulation layer 222 can also be made of different materials.

In addition, the insulation layer 222 is a hollow ring structure. Preferably, the shape of the insulation layer 222 is the same as that of the main body part 221, which can better increase the rigidity of the back plate 20.

In the MEMS microphone 100 of the present invention, by stacking the insulation layer 222 on the main body part 221 of the back plate 20, the rigidity of the fixed part 22 connecting the back plate 20 and the substrate 10 is increased, so that the back plate 20 has less film damping. Therefore, the MEMS microphone 100 has a better signal to noise ratio.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone comprising:
   a substrate with a back cavity;
   a capacitive system supported by the substrate, including a back plate and a vibration diaphragm fixed on the substrate at a side of the back plate close to the substrate; wherein
   the back plate includes a middle part, a fixed part surrounding the middle part and being fixed to the substrate;
   a thickness of the fixed part is greater than a thickness of the middle part;
   the fixed part includes a first surface away from the substrate and a second surface opposite to the first surface; and
   each of the first surface and the second surface includes a first arc connected to the middle part and protruding away from the substrate and a second arc connected to the first arc and protruding away from the substrate, both the first arc and the second arc on the second surface are spaced apart from the vibration diaphragm.

2. The MEMS microphone as described in claim 1, wherein the fixed part includes a main body part and an insulation layer stacked on the main body part, and the insulation layer is connected to the first surface of the fixed part.

3. The MEMS microphone as described in claim 2, wherein the main body part has a thickness same to the middle part.

4. The MEMS microphone as described in claim 2, wherein the main body part and the insulation layer are made of the same material.

5. The MEMS microphone as described in claim 2, wherein the main body part and the insulation layer are made of different materials.

6. The MEMS microphone as described in claim 2, wherein the main body part and the insulation layer are of integrated structure or separated structure.

7. The MEMS microphone as described in claim 2, wherein the insulation layer is a hollow ring structure.

8. The MEMS microphone as described in claim 2, wherein the main body part and the insulation layer have the same shape.

9. The MEMS microphone as described in claim 1, wherein the first surface and the second surface have the same shape.

* * * * *